PROCESS FOR MAKING A PRINTED CIRCUIT

Filed June 13, 1956 2 Sheets-Sheet 1

INVENTORS
Norman L. Greenman
BY John A. Zagusta
Paul L. Anderson
J. Stanley Churchill
ATTORNEY INVENTORS
Norman L. Greenman
John A. Zagusta
Paul L. Anderson
BY
J. Stanley Churchill
ATTORNEY United States Patent Office 2,988,839
Patented June 20, 1961

2,988,839
PROCESS FOR MAKING A PRINTED CIRCUIT
Norman L. Greenman, Danielson, Conn., John A. Zagusta, Jackson Heights, N.Y., and Paul L. Anderson, Rockville, Conn., assignors to Rogers Corporation, Manchester, Conn., a corporation of Massachusetts
Filed June 13, 1956, Ser. No. 591,121
1 Claim. (Cl. 41—37)

This invention relates to printed circuits and to methods of making the same.

The primary object of the invention is to provide novel and improved methods of producing printed circuits embodying a molded insulating fibrous base member and an electrically conductive pattern on one or more surfaces of the molded insulating fibrous base member.

Another object of the invention is to provide novel printed circuits of the character above referred to which may be economically manufactured and possess characteristics which render them particularly suited for special purposes.

With these general objects in view and such others as may hereinafter appear the invention consists in the novel methods of making printed circuits embodying a molded insulating fibrous base member and an electrically conductive pattern on one or more surfaces of the molded insulating fibrous base member and also certain novel and useful printed circuits resulting from the practice of some of the methods forming the subject matter of the present application as will be described.

In the drawings we have illustrated more or less diagrammatically in plan and sectional detail a sufficient portion of a series of molded insulating fibrous base members, each having a typical electrically conductive pattern secured on a surface thereof in accordance with the various methods forming the subject matter of the present invention wherein:

FIGS. 9 and 10 are more or less diagrammatic views illustrating in section the mold and associated parts for producing the present printed circuit and which will be hereinafter referred to;

FIGS. 11, 12, 13 and 14 are sectional views of the uncured and cured insulating fibrous base to which the electrically conductive pattern is applied in accordance with different methods embodying the invention;

FIG. 15 is a sectional detail illustrating the preferred method by which the unwanted metal may be ejected from the mold as will be described; and FIG. 16 is a sectional detail illustrating the steps in still another method of making the present printed circuit which will be hereinafter referred to.

Figure 1:
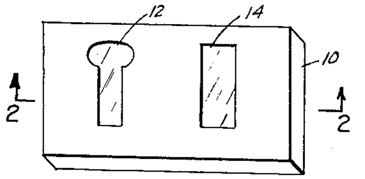
FIG. 1 is a plan of a typical molded printed circuit.

In its preferred form the invention is concerned primarily with the production of so-called "printed circuits" of the type wherein an assembly of a moldable insulating fibrous base sheet having the requisite physical and electrical properties is provided upon a surface thereof with an electrically conductive detailed metallic pattern and the assembly subjected to molding during which it may be formed and cured by the proper temperature, time and pressure cycle following the disclosure in our copending application, Serial No. 566,962, filed February 21, 1956.

As set forth in our said application the assemblies may be provided with holes for the reception of accessory elements, such as terminals, connectors and the like, by ordinary punching operations or in any other suitable manner, as by formation during the molding operation. After the assembly has been produced, as thus far described, it may be molded and the accessory elements anchored in the base by the flow of moldable material during the molding operation in and around the terminals, connectors, or other accessory elements, thus producing a molded assembly in a most economical and practical manner.

One of the principal advantages flows from the fact that the assembly, as thus far described, lends itself to molding operations in which it may be formed and cured by the proper temperature, time and pressure cycle to a three-dimensional shape, as distinguished from the phenolic laminates which have been generally heretofore used for the production of printed circuits and which have been available in flat, fully cured sheets, thereby restricting the pattern and the board to planar or two-dimensional surfaces. For example, the present assembly may be molded and shaped to form ripht angle pieces to provide the structure with ribs for reinforcing purposes, to enable slots to be molded therein which otherwise would have to be machined to provide mounting corners for the assembly and to enable the whole chassis of the printed circuit to be molded. Tapered holes for the accessories and molded edges may be formed during the molding operation. In general this characteristic opens up a wide range of design possibilities as compared to the limitations of the flat, punched phenolic laminates of the prior art.

As also set forth in said application the moldable fibrous resin base preferably embodies a curable resin. The metal conductive pattern may be formed and applied by a stamping operation and adhesively affixed to the surface of the moldable fibrous base. Thereafter the openings or holes for the reception of the terminal pins, socket pins, eyelets or other hardware can be molded into the base without prepunching the uncured sheet, and eliminating subsequent drilling, mounting and staking operations. After the basic pattern has been applied, then the assembly is subjected to molding at temperatures and pressures according to the particular resin employed resulting in the formation of a resin skin covering all edges of the base assembly, and in addition covering the walls of any holes which have been formed in the base, either prior to or during the molding operation. This skin of resin distinguishes the present molded base from the prior art structures and represents a very substantial advance in the art in that the moisture absorption characteristics and the accompanying effect on the electrical insulating properties of the base are greatly reduced. The molding operation may and preferably will result in the production of a finished molded electrically conductive pattern whose upper surface is flush with the surface of the base, allowing portions or all of the pattern to be used as a switch or commutator stator. In addition the pattern can be embossed onto or raised above the surface.

The moldable fibrous base preferably embodies thermosetting resins as the impregnant for the fibrous board or sheet, and such resins may be of the heat curable type, of the pressure curable type, and preferably of the heat and pressure curable type. Such resins may include the phenolic formaldehyde resins, the melamine resins, epoxy resins, polyester resins, the urea formaldehyde resins, silicones and others. Preferably, portions of such resins may vary from 25% to 70% by weight based on the weight of the finished product. The fibrous base itself may be formed in whole or in part from fibers including cellulose, glass, asbestos or similar fibers, such as polyamide, polyester, aluminum oxide fibers and various mineral fibers and combinations thereof.

In practice copper is preferably utilized in producing the metallic electrically conductive pattern, preferably in the form of a foil or produced by electroplating or other methods, although other suitable metals may if desired by used for this purpose. As will be hereinafter described in connection with certain of the novel specific methods of producing printed circuit panels in accordance with the present invention, it is desirable that the metal foil be provided with a heat curable adhesive of the type which may be subsequently cured by the application of both heat and pressure or heat alone during the molding operation. Alternatively, the adhesive may be applied as a coating to the fibrous board, in which case the strength of adhesive bond may be enhanced by a treatment to provide a film of copper oxide on the surface of copper pattern to be bonded. Such surface treatment of the copper may be readily accomplished by immersion in an alkaline bath. Typical of these adhesives include any of the commercially available pressure or heat sensitive adhesives including:

Phenolic Butyral Adhesives, manufactured by Bakelite Co.

Modified Epoxy Adhesives, manufactured by Rubber & Asbestos Corp.

The surface coating which may be utilized on the surface of the fibrous base sheet, as set forth in our said application, may include epoxy resins, phenolic formaldehyde resins, the various commercial polyester resins, the melamine resins, the silicones and others. The surface coating is preferably of a nature such as to be substantially non-flowing during molding, thus insuring that no resin skin forms over the electrically conductive pattern. The formation of such skin would interfere with the soldering operations.

In accordance with the present invention a number of specific methods will be hereinafter described which contemplates the formation of the electrically conductive metallic pattern on the moldable fibrous insulating base member by a die cutting operation in which one member of the die having the pattern in embossed or debossed relation cooperates with the fibrous base to effect the cutting operation, the base serving as the second member of the die. The other aspects of the invention will be hereinafter described in connection with specific methods of producing the printed circuit.

Referring now to the drawings, in FIG. 1 we have illustrated a molded fibrous insulating base 10 embodying a curable resin upon which an electrically conductive metallic pattern typified by two pattern areas 12, 14 may be formed thereon by any of the several methods to be hereinafter described.

Figure 2:
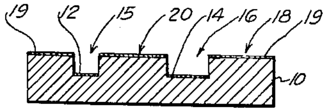
FIGS. 2 through 8 are sectional details taken on the line 2—2 of FIG. 1 and illustrating the different methods contemplated by the present invention for producing the electrically conductive patterns on the insulating fibrous base members.

Referring now to FIG. 2, we have illustrated therein an intermediate product in which the metallic pattern areas 12, 14 are formed in the bottoms of depressions 15, 16 formed in the moldable fibrous base as illustrated. The undepressed portions 18 of the moldable fibrous base sheet are covered by and have secured thereto the unwanted area 19 of the copper or other sheet metal of which the electrical conductive pattern is formed. In practice in accordance with the invention the pattern may be produced by dieing the pattern from a copper or other metal foil sheet 20 utilizing a mold in which the top half of the mold (not shown) may comprise any usual or preferred form of molding element having the pattern embossed on the contacting surface thereof to project therefrom. This half of the mold is utilized with the sheet of uncured moldable fibrous base serving as the second molding element, and prior to the closure of the mold a copper or other metal foil sheet 20, preferably with its undersurface adhesively coated with a curable resinous adhesive, is interposed between the upper half of the mold and the surface of the moldable fibrous base, and as the mold closes the desired pattern is cut from this metallic foil sheet by the action of the embossed pattern on the upper half of the mold during the movement of the embossed portion down into the surface of the fibrous base. During this operation the pattern is cut by the shearing action of the embossed portions of the mold against the uncured fibrous base material, the latter acting as the lower half of the die or mold. The patterns 12, 14 illustrated in FIG. 2 are shown deposited in the bottom of the depressions in the insulating fibrous base and the molding operation is otherwise conducted in accordance with known procedure utilizing the proper temperature, time and pressure cycle depending upon the character of fibrous base and the amount and character of resin embodied in the fibrous base.

It will be understood that the assemblies of the moldable insulating fibrous base and the metallic pattern may have holes formed therein, as by punching operations, or during the molding operation. Either before or after the molding operation the accessories, such as terminals, connectors, and the like, may be assembled in the holes and affixed to the base and in operative relation to the metallic circuit pattern. During the molding operation the desired contour may be imparted to the finished panel in planar or three dimensional shape and the edges of the panel and the walls of any holes formed therein coated with a resin skin following the general procedure of our said application.

In some instances the unwanted bodies 19 of copper which remain affixed to the top surfaces of the fibrous base after the piece shown in FIG. 2 has been subjected to the molding operation may be permitted to remain in such position and the molded printed circuit assembly utilized in such condition. In other instances we may prefer to remove such unwanted bodies of copper, and this may be done mechanically preferably by microplaning operations utilizing known apparatus and following known microplaning procedure.

Figures 9, 10, 11, 12, 13, 14, 15, 16:
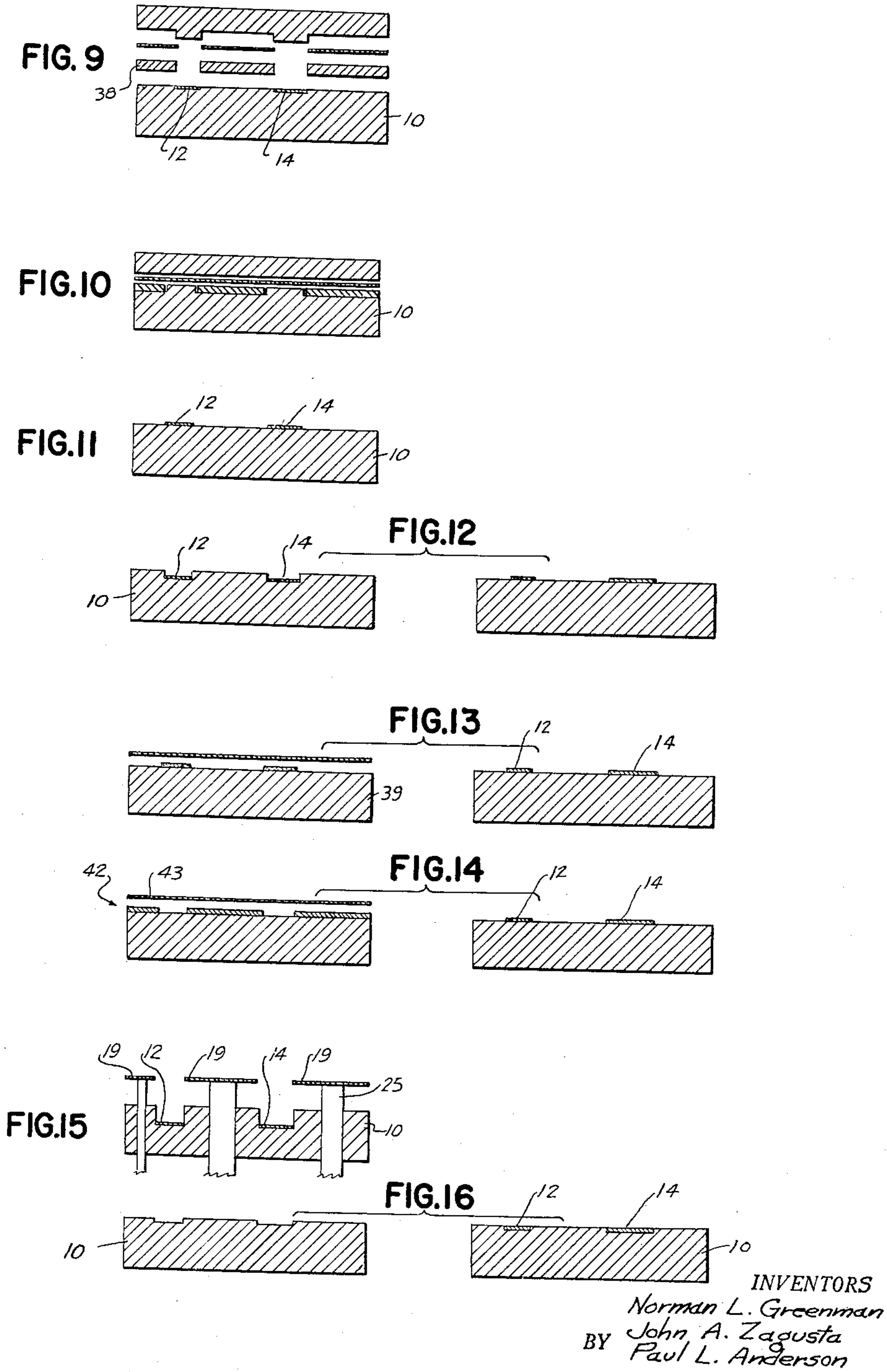

As illustrated and described in our prior application, Serial No. 566,962, one method of producing the metallic pattern involves the die blanking of the pattern on the uncured fibrous base sheet, followed by a molding operation, and in producing the product illustrated in FIG 2 the blanking tools may comprise a punch, a rubber stripping plate and a die having the pattern embossed to cooperate with the insulating fibrous base sheet in dieing out the pattern. The fibrous base sheet, as above described in connection with the method of producing the product of FIG. 2, serves as the second member of the die, and the pattern is pushed into the uncured fibrous base sheet to deposit the metallic pattern in the depressed portions of the base sheet. The unwanted copper is preferably salvaged for scrap, and the assembly of metallic pattern and fibrous base is then molded in accordance with the method diagrammatically illustrated in FIG. 2 and above described. By using a flat plate in the mold the assembly may be finished into the structure shown in FIG. 12 wherein the metallic pattern is flush with the finished surface of the fibrous base after molding. An alternative procedure may be followed wherein the procedure described in our said application contemplates the dieing of the metallic pattern by the cooperation of an embossed die element and a metallic stripper plate. This produces the product shown in FIG. 11. Thereafter the product of FIG. 11 is subjected to a molding operation in which a flat plate is employed to produce a molded product wherein the metallic pattern is flush with the surface of the fibrous base member.

Another method which may be employed if found of advantage contemplates the debossing of the pattern areas 12, 14 in the fibrous base sheet and the molding of the sheet to provide a debossed pattern in the surface thereof. If desired, the debossed pattern areas may be formed during the molding of the fibrous sheet into final shape and contour. Thereafter copper foil coated with a curable adhesive, preferably a resinous adhesive such as above described, is blanked into the debossed pattern areas preferably utilizing a resilient pad, such as a rubber pad acting as a punch against the walls of the debossed pattern in the cured board acting as a die. The unwanted copper on the surfaces of the fibrous base is not firmly adhered thereto and may be readily removed. After removal of this unwanted copper the fibrous base member with the metallic pattern adhering to the bottom of the debossed areas is subjected to baking to effect curing of the adhesive and to effect a good bond between the copper pattern and the finished molded piece. The temperature of the baking operation will depend on the requirements of the particular adhesive used.

In some instances it may be preferred to provide mechanism in the form of ejection pins 25 located in the mold in such positions as to lift the unwanted copper 19 away from the surface of the finished molded piece as the press opens. The provision of these spring actuated ejection pins 25 facilitates the stripping of the unwanted copper from the surface of the molded piece. The pins and their operation are illustrated in FIG. 15 and are illustrated in connection with the structure shown in FIG. 2. The ejection pins are arranged to pass through holes formed in the insulating fibrous member so that when the press opens the springs elevate the pins, carrying the unwanted copper areas into a position such as is illustrated in FIG. 15.

Figure 3:
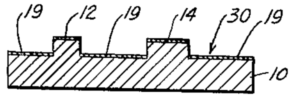

All of the methods and apparatus thus far described produce printed circuit assemblies wherein the metallic pattern 12, 14 is disposed in depressions or debossed portions of the fibrous base sheet and result from the method wherein the upper half of the mold is embossed and the cutting action to form the pattern is effected with the fibrous base material acting as the lower half of the die. In some instances we may prefer to reverse the relationship between the upper half of the mold and the fibrous base sheet. As illustrated in FIG. 3, the metallic patterns 12, 14 are disposed above the remaining upper surface 30 of the fibrous base sheet so that in those instances the cutting action for producing the metallic pattern is accomplished utilizing those areas of the upper die which are not debossed as the cutting members cooperating with the fibrous base sheet as the mold closes.

In the resulting product illustrated in FIG. 3 the unwanted copper areas 19 are disposed in what amounts to depressions between or surrounding the upstanding metallic pattern. For many purposes the unwanted copper may remain in the position illustrated in FIG. 3, and when the assembly is subjected to curing in the manner above described in connection with the debossed pattern type of structure shown in FIG. 2, the unwanted copper areas remain molded onto and bonded to such surfaces.

Figure 4:
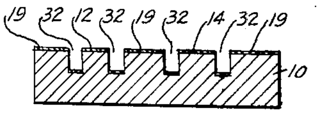
Figure 5:
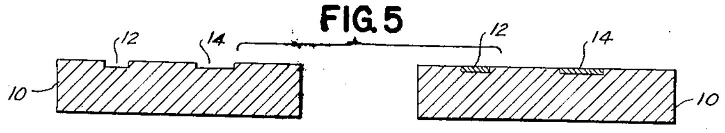
Figure 6:
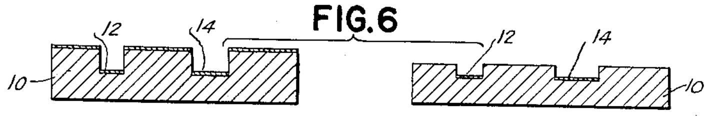

Referring now to FIG. 4, in some instances wherein it is desirable to permit the unwanted copper to remain on the surface of the fibrous base sheet and at the same time to provide a structure in which the metallic pattern also lies in the same plane as the unwanted copper, we may prefer to provide the upper half of the die with a plurality of embossed portions preferably of thin dimensions disposed so that when the mold or press is closed the metallic pattern is cut from the copper foil interposed between the base sheet and the upper half of the die by the thin embossed portions of the upper die, the base sheet serving as the lower half of the die. In this manner each portion of the metallic pattern indicated at 12, 14 in FIG. 4 is separated from the adjacent unwanted copper portions 19 lying in its plane by the narrow depressions indicated at 32. In this manner the metallic pattern is electrically insulated from the unwanted copper, both the portions lying in the same plane as the metallic pattern, and also those portions which are disposed in the bottom of the insulating depressions. The cutting action is produced in the manner above described in connection with the production of the structure shown in FIGS. 2 and 3 wherein the fibrous base sheet acts as a second die element.

Figure 7:
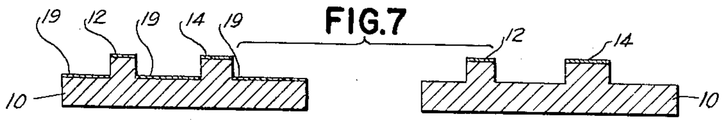
Figure 8:
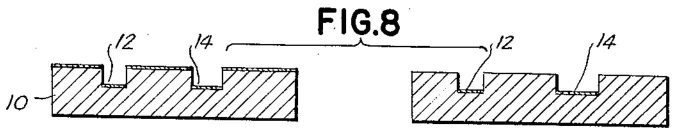

As a modification of the method above described in connection with FIG. 2, after the copper foil has been adhesively applied to the surface of the fibrous base sheet and the metallic circuit pattern has been formed by the debossed upper half of the mold, we may prefer to apply, as by roller coating, a layer of a suitable resist to the upstanding portions of the molded assembly shown in FIG. 7. Thereafter the unwanted copper portions 19 may be etched away following usual and known etching practice. The roller coating operation enables the resist to be conveniently applied to the pattern by reason of its upstanding condition.

A still further modification of a method disclosed in our copending application Serial No. 566,962, above referred to, is diagrammatically illustrated in FIG. 9 wherein a stripper plate 38 is embodied in the mold and wherein the upper half of the mold is embossed, and after the metallic pattern has been severed by the embossed portions of the mold in cooperation with the pattern openings formed in the stripper plate 38, the metallic pattern is forced through the openings onto the surface of the underlying base sheet as shown. The assembly thus formed may then be molded utilizing the proper temperature and pressure, as set forth in said application, depending on the particular curable resin embodied in the fibrous base sheet. The top of the stripper plate may be treated with "Teflon" or other suitable material to prevent adhesion of the adhesive copper foil thereto. If desired, the upper part of the mold may present a flat surface, and during the molding operation the fibrous base sheet will be forced up through the pattern cut in the stripper plate to form upstanding portions to which the copper foil is adhered. When the base sheet is separated from the stripper plate at the end of the molding the copper foil shears along the pattern line.

Another modification of the invention is diagrammatically shown in FIG. 4 wherein the upper half of the mold is embossed and utilized to form the pattern as debossed portions in the surface of the fibrous base sheet. Thereafter the entire upper surface may be metallized by known hot spraying methods utilizing known zinc or zinc compositions and known spray guns for the purpose. This provides a satisfactory base for electroplating operations. By roller coating a known resist on the top surface of the debossed panel the depressed areas are left free of resist so that they may be electroplated to produce the metallic pattern as indicated in FIG. 4.

Another modification of the foregoing methods contemplates the application to the uncured fibrous base sheet 39 of adhesive in the desired circuit pattern. This may be accomplished by silk screening or printing the adhesive thereon and is then followed by molding the base sheet in contact with a copper foil. The molding operation effects the bonding of the copper foil only in the pattern desired, enabling the unwanted copper which is not bonded to the base sheet to be easily stripped therefrom leaving the finished product shown in FIG. 13.

As an alternative of the modification just described, a mold release 42 of any usual or preferred composition may be applied, as by silk screening, printing or otherwise to the portions of an uncured fibrous base sheet other than the pattern of the desired circuit. The fibrous base sheet is then molded in contact with the adhesive surface of an adhesive coated copper foil 43, and as a result of the molding operation the copper foil is caused to adhere to the base sheet only in those cases where no release is present or in other words only to the desired pattern. The unwanted copper which is not bonded to the board may be easily stripped from the base sheet leaving the desired metallic circuit pattern bonded to the base sheet as shown in FIG. 14.

Another method of producing the present printed circuit panel involves the introduction of the metal foil between an embossed upper die and the uncured fibrous base sheet and the molding operation to produce the structure illustrated in FIGS. 1 and 2 as above described. Thereafter the molded panel may be immersed in boiling wax, such as paraffin, leaving a film on the surface and in the depressed pattern area. The wax on the surface may then be removed, as by rubbing with a towel, and the panel etched to chemically remove the unwanted metal surface. Thereafter the immersion of the panel in boiling water will flow off the wax which has protected the depressed metal pattern, and if desired, this wax may be reclaimed, leaving a product in which the desired pattern is disposed in the depressions in the base sheet.

Having thus described the invention, what is claimed is:

In the method of making a printed circuit panel wherein a metallic pattern is formed and secured to at least one surface of a fibrous base sheet impregnated with a curable resin and wherein the assembly of pattern and base sheet is subjected to a molding operation to impart a desired shape to the panel and to cure the resin, the steps comprising introducing a metal foil having an adhesive undersurface between a fibrous base sheet having a plane surface confronting said metallic foil and a flat molding element, interposing between the metal foil and the fibrous sheet a stripper plate having openings therein defining the metallic pattern, then performing the molding operation whereby to cause the base sheet to be forced upwardly through the stripper plate to bond with the adhesive metal foil defining the pattern, and thereafter separating the stripper plate from the fibrous base sheet by shearing the metal along the pattern line, and separating the metallic pattern from the foil.

References Cited in the file of this patent

UNITED STATES PATENTS

| | | |
|---|---|---|
| 119,900 | Van Cleve | Oct. 10, 1871 |
| 1,640,787 | Martin et al. | Aug. 30, 1927 |
| 2,279,567 | Holman | Apr. 14, 1942 |
| 2,288,735 | O'Connell | July 7, 1942 |
| 2,535,674 | Franklin | Dec. 26, 1950 |
| 2,644,262 | Shoenberg et al. | July 7, 1953 |
| 2,647,852 | Franklin | Aug. 4, 1953 |
| 2,699,424 | Nieter | Jan. 11, 1955 |
| 2,716,268 | Steigerwalt | Aug. 30, 1955 |
| 2,772,501 | Malcolm | Dec. 4, 1956 |
| 2,796,634 | Chellis | June 25, 1957 |